United States Patent [19]

Ugari et al.

[11] 4,416,024
[45] Nov. 15, 1983

[54] DISTORTION REDUCING CIRCUIT IN FM RECEIVER

[75] Inventors: Takenori Ugari, Hirakata; Yoichi Yano, Higashiosaka, both of Japan

[73] Assignee: Sanyo Electric Co., Inc., Moriguchi, Japan

[21] Appl. No.: 210,378

[22] Filed: Nov. 26, 1980

[30] Foreign Application Priority Data

| Dec. 17, 1979 | [JP] | Japan | 54-164297 |
| Dec. 21, 1979 | [JP] | Japan | 54-167027 |
| Dec. 27, 1979 | [JP] | Japan | 54-182738[U] |
| Oct. 14, 1980 | [JP] | Japan | 55-146691[U] |

[51] Int. Cl.³ .............................................. H04B 1/10
[52] U.S. Cl. .................................... 455/303; 455/312; 381/10; 381/11
[58] Field of Search ................. 455/65, 212, 213, 220, 455/222, 225, 295, 297, 296, 303, 305, 306, 312, 226, 205, 206, 235, 249; 375/99, 102, 103; 329/132, 133; 328/162; 324/57 N, 57 DE; 179/1 GJ, 1 GM

[56] References Cited

U.S. PATENT DOCUMENTS

| 2,363,649 | 11/1944 | Crosby | 329/132 |
| 3,569,633 | 3/1971 | Brahman | 455/212 |
| 3,803,496 | 4/1974 | Groen | 455/306 |
| 4,006,419 | 2/1977 | Liman | 455/212 |
| 4,063,039 | 12/1977 | Endres et al. | 455/305 |
| 4,066,845 | 1/1978 | Kishi | 455/212 |
| 4,210,094 | 7/1980 | Kondo | 455/344 |

FOREIGN PATENT DOCUMENTS 1511202  5/1978  United Kingdom .

*Primary Examiner*—Marc E. Bookbinder
*Attorney, Agent, or Firm*—Darby & Darby

[57] ABSTRACT

A distortion reducing circuit in an FM receiver comprises a distortion detector for receiving the output of an FM demodulating circuit. The distortion detector comprises a high pass filter, the output of which is applied to a capacitor so that the same is rapidly charged. The conduction of the transistor is changed as a function of the charge voltage across the capacitor and a high frequency component in the output of the FM demodulating circuit is reduced in association with the conduction of the transistor.

21 Claims, 16 Drawing Figures

FIG. 1
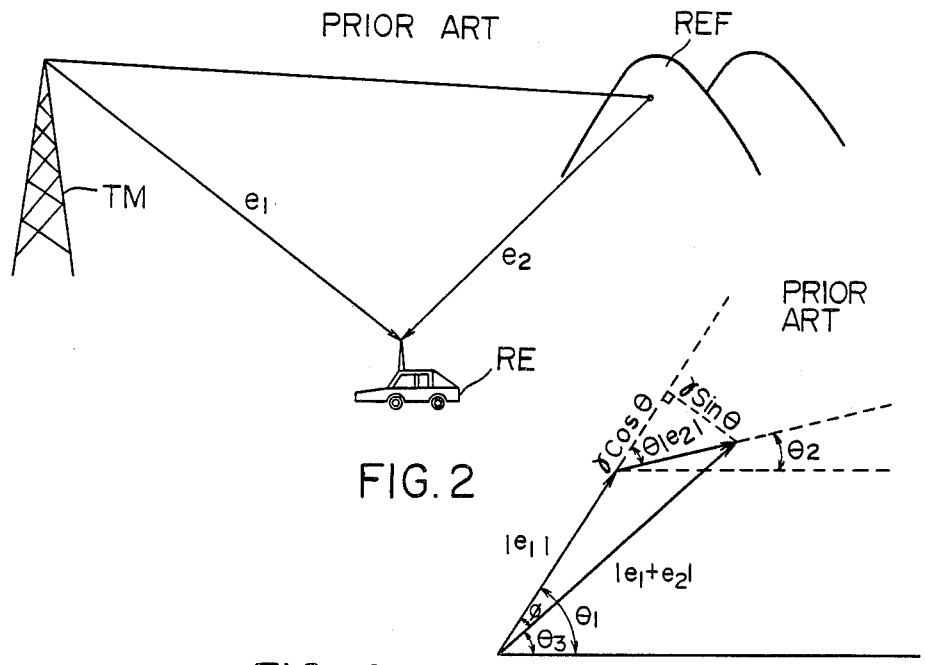
FIG. 2
FIG. 4
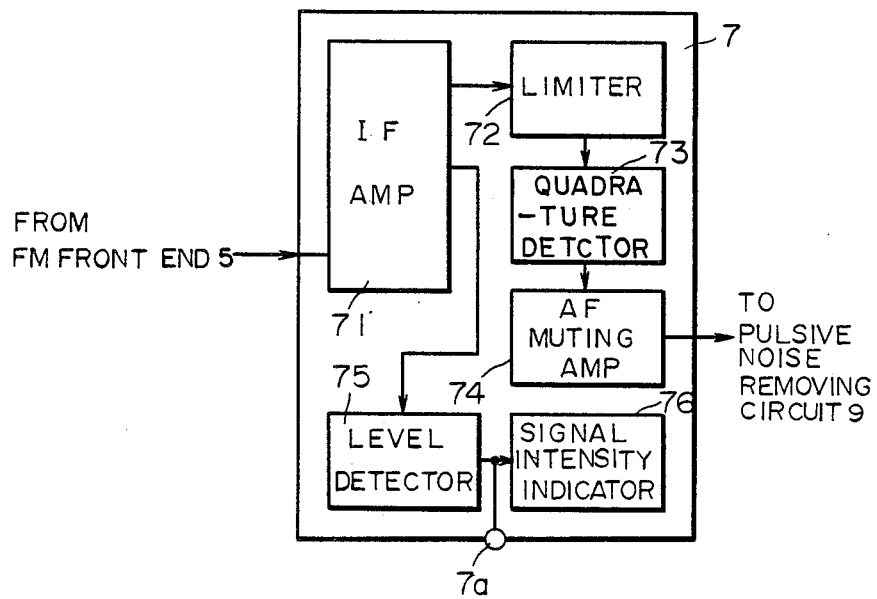

DISTORTION REDUCING CIRCUIT IN FM RECEIVER

BACKGROUND OF THE INVENTION

1. Field of the Invention

The present invention relates to a circuit for reducing distortion of an FM receiver. More specifically, the present invention relates to a circuit for reducing a noise and distortion unique to an FM receiver which is borne on a moving vehicle, for example.

2. Description of the Prior Art

Conventionally, a so-called car stereo set has been borne on a vehicle. Such a car stereo set comprises an FM receiver. Such FM receiver of a car stereo set gives rise to a noise and distortion because of various external causes. For example, there is a noise caused by a fluctuation of an electric field strength based on a Rayleigh distribution occuring in a weak electric field area. More specifically, in a case where the electric field strength changes from a relatively large state to a small state in a weak electric field area, for example if the input electric field decreases by 30 dB, the S/N ratio is degraded by approximately 55 dB. More specifically, in such a case the noise level (white noise) increases by 55 dB and the increase of the noise level causes an uncomfortable feeling to the ear. There is also a noise caused by so-called multi-path distortion caused by an influence of a reflective wave. It has been known that the former and the latter appear at the rate of approximately 3:7. Conventionally, an approach was taken that in order to mitigate a noise because of the former, i.e. the Rayleigh fluctuation the receiving electric field strength is detected by the output of the intermediate frequency signal circuit, for example, the high frequency region of the demodulated output is suppressed when the electric field strength exceeds a given level and the stereo separation is reduced, whereby the apparent S/N ratio is improved. However, this approach naturally degrades the stereo separation. Furthermore, no particular useful solution has been proposed, in a car stereo set, to a noise because of the multipath distortion. Several solutions also have been proposed in a so-called home stereo set. Some of these are to enhance the directivity of an antenna and rotate the antenna so that the directivity direction may coincide with a transmitter, or to detect a phase delay and a scaler amount of a reflected wave and offset the same with a signal of the same scaler amount and of the opposite phase. However, any of the conventionally proposed solutions for the so-called home stereo set were not able to be applied to a moving FM receiver such as a so-called car stereo set wherein the receiving state changes instantaneously.

Reduction of stereo separation as described above has been disclosed in U.S. Pat. No. 3,539,729, issued Nov. 10, 1970 to D. R. von Recklinghausen and entitled "Apparatus for Reducing Interference in the Transmission of Electric Signals". However, the approach disclosed in the referenced patent does not achieve the effectiveness as obtained by the present invention in response to distortion. Only the second embodiment in the referenced patent is of interest to the present invention. The second embodiment of the referenced patent is directed to an FM stereo receiver. The second embodiment makes use of dependency of a signal to noise ratio upon an antenna input signal intensity, thereby to achieve an additional automatic control in addition to the first embodiment of the referenced patent. For the purpose of the above described additional automatic control of the second embodiment, the output of the FM tuner is applied to a high pass filter. The cutoff frequency of the high pass filter is selected to be the maximum modulation frequency, i.e. 75 kHz. The output of the high pass filter is proportional to the amount of a noise existing in a push-pull fashion in the output of the stereo demodulator. The output of the high pass filter is amplified and is further rectified. The rectified output and the difference voltage are combined and the combined output is applied to a lamp drive circuit. A lamp being driven by the lamp drive circuit is optically coupled to a variable resistor having a resistance value changeable as a function of the intensity of the light from the lamp. The above described variable resistor is interposed between the respective channels of the stereo demodulated output. According to the second embodiment of the referenced patent, when the high frequency noise component included in the FM detector increases, the rectified output correspondingly increases and accordingly the light from the lamp becomes strong. Therefore, the resistance value of the variable resistor optically coupled to the lamp decreases. This means that stereo separation between both channels of the stereo output decreases. The decrease of stereo separation improves a signal to noise ratio. Thus, the referenced patent changes stereo separation in accordance with a noise component included in the detected output, thereby to provide for a required minimum signal to noise ratio. However, the referenced patent fails to disclose any means for removing such distortion component as a multi-path distortion, to which the present invention is directed. Furthermore, the referenced patent requires two control signal paths including a bandpass filter and a high pass filter and for this reason a circuit configuration of the referenced patent is relatively complicated.

SUMMARY OF THE INVENTION

Briefly described, the present invention is adapted to detect a distortion component upon receipt of the output of a demodulating circuit, thereby to reduce a distortion component included in the output of the demodulating circuit in accordance with the magnitude of the distortion component. According to the present invention, therefore, an influence caused by such a distortion as a multi-path distortion influenced by a reflective wave can be considerably reduced. In addition, since such distortion detection and distortion reducing operation are automatically performed, distortion can be very effectively reduced even in the case where a receiving condition is changing from time to time. Therefore, the present invention is particularly effective to such an FM receiver as a car stereo set which is used in a moving condition. It would be appreciated that in the above described respect the present invention achieves an entirely different meritorious effect as compared with the previously referenced patent.

In a preferred embodiment of the present invention, a high frequency component in the demodulated output is reduced for the purpose of reduction of distortion. According to the preferred embodiment, such high frequency component reducing means can be implemented with a relatively simple circuit configuration. Even in the case where an FM receiver is an FM stereo receiver, the embodiment can effectively remove a distortion component without degrading stereo separation.

In a further preferred embodiment of the present invention, stereo separation is further changed as a function of the distortion detected output in addition to the above described high frequency reduction. By doing so, not only a distortion component but also a noise component included in the demodulated output can be effectively reduced.

In still a further preferred embodiment of the present invention, a high pass filter, a rectifying circuit for receiving the output of the high pass filter, and a charging/discharging circuit for receiving the output of the rectifying circuit are provided for the purpose of detecting a distortion component. The charging time constant of the charging/discharging circuit is selected to be small and the discharging time constant of the charging-/discharging circuit is selected to be large. According to the preferred embodiment, the apparatus can be quickly responsive to a change from a state without distortion to a state with distortion, whereas the apparatus is slowly responsive to a change from a state with distortion to a state without distortion. Accordingly, any offensive noise which might occur if the apparatus is quickly responsive to a change from a state with distortion to a state without distortion is prevented from occurring.

In still a further preferred embodiment of the present invention, circuit means for reducing a distortion component is forcibly operated responsive to manual operation of a manual switch such as an operation mode selecting switch, a power supply switch or the like. According to the preferred embodiment now in description, therefore, a noise and a distortion component incidental to such switch operation can be effectively suppressed from occurring.

Accordingly, a principal object of the present invention is to provide a distortion reducing circuit in an FM receiver for considerably reducing such distortion as a multi-path distortion.

Another object of the present invention is to provide a distortion reducing circuit in an FM receiver structured with a simple circuit configuration.

A further object of the present invention is to provide a distortion reducing circuit in an FM stereo receiver that can effectively reduce a distortion component without degrading stereo separation.

Still a further object of the present invention is to provide a distortion reducing circuit in an FM receiver that can effectively remove a distortion component in the case where a receiving condition changes from time to time.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram for explaining a multi-path phenomenon which constitues the background of the present invention;

FIG. 2 is a vector diagram for explaining a composite wave of a direct wave and a reflected wave;

FIG. 4 is a block diagram showing in detail the IF amplifying/-demodulating circuit 7 in FIG. 3;

DESCRIPTION OF THE PREFERRED EMBODIMENTS

Figure 3:
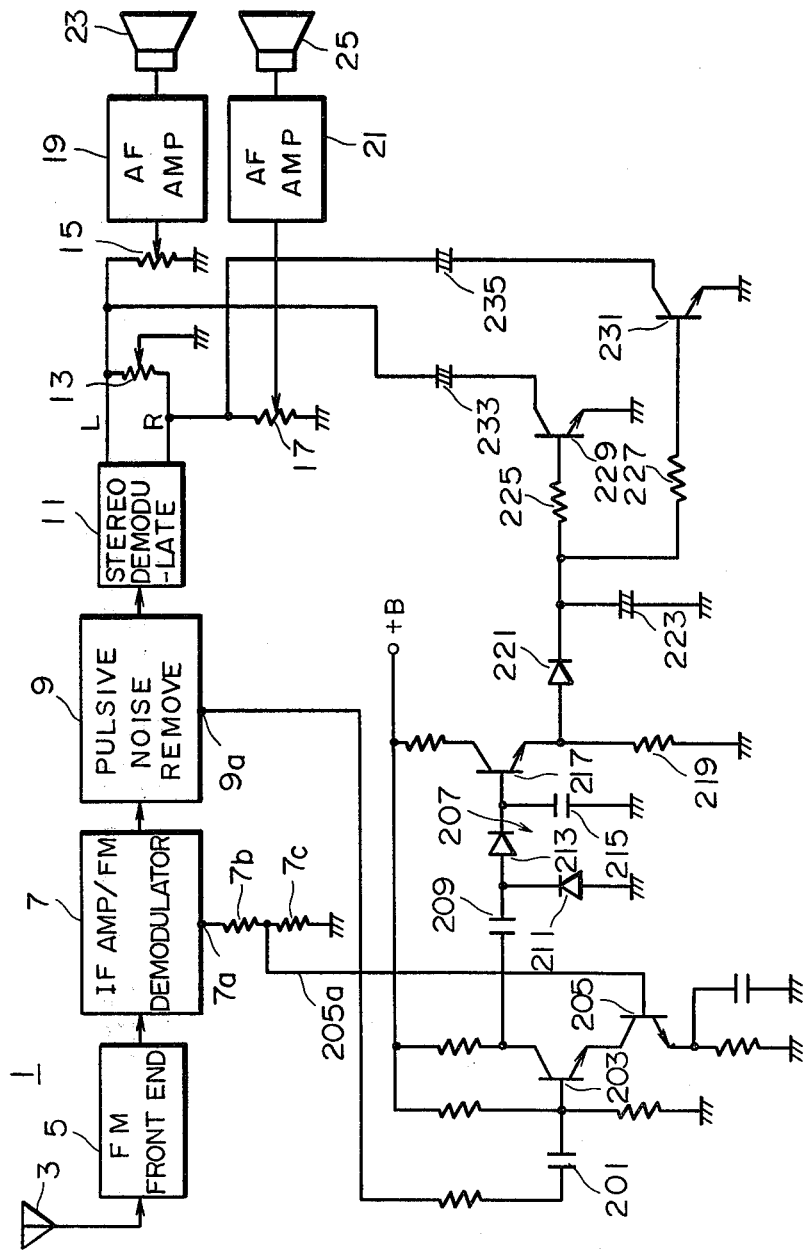
FIG. 3 is a block diagram showing one embodiment of the present invention.

Before enterring into a description of a preferred embodiment, a multi-path distortion will be described with reference to FIGS. 1 and 2.

FIG. 1 is a diagrammatic view for explaining a multi-path phenomenon and FIG. 2 is a vector diagram showing a multi-path state. As shown in FIG. 1, an FM electric wave transmitted from a transmitting station TM appears as a composite wave of a direct wave $e_1$ reaching an FM receiver (not shown) of a receiving station RE and a reflected wave $e_2$ reaching the receiving station RE after reflection from a reflecting material REF such as a mountain, a building or the like. More specifically, the direct wave $e_1$ is given by the following equation (1).

$$e_1 = \sin(\omega_c t + m \cos \omega_m t) \tag{1}$$

On the other hand, the reflected wave $e_2$ is given by the following equation (2).

$$e_2 = \gamma \sin\{\omega c(t-\tau) + m \cos \omega m(t-\tau)\} \quad (2)$$

where ωc is a carrier angular frequency, m is a modulation index, ωm is a modulation angular frequency, γ is a reflection amount, and τ is a delay time. Accordingly, the composite wave e is given by the following equation (3).

The phase difference $\theta_1$ of the direct wave $e_1$ and the phase difference $\theta_2$ of the reflected wave $e_2$ are obtained from the previously described equations (1) and (2) and are given by the following equations (2a) and (2b).

$$\theta_1 = \omega ct + m \cos \omega mt \quad (2a)$$

$$\theta_2 = \omega c(t-\tau) + m \cos \omega m(t-\tau) \quad (2b)$$

Assuming that the phase difference between the direct wave $e_1$ and the reflected wave wave $e_2$ is θ, the phase difference θ is given by the following equation (2c).

$$\theta = \theta_1 - \theta_2 \quad (2c)$$

By substituting the above described equation (2c) for the following equation, the equation (3) is obtained.

$$e_1 + e_2 = \sin\theta_1 + \gamma\sin\theta_2$$

$$e_1 + e_2 = \sin\theta_1 + \gamma\sin(\theta_1 - \theta)$$

$$= \sin\theta_1 + \gamma(\sin\theta_1\cos\theta - \cos\theta_1\sin\theta)$$

$$= (1 + \gamma\cos\theta)\sin\theta_1 - \gamma\cos\theta_1\sin\theta$$

where $A\sin X \pm B\cos X =$ $$\sqrt{A^2 + B^2} \sin\left\{X \pm \tan^{-1}\left(\frac{B}{A}\right)\right\} \text{ and, therefore,}$$

$$e_1 + e_2 = \sqrt{(1 + \gamma\cos\theta)^2 + \gamma^2\sin^2\theta} \cdot \quad (3)$$

$$\sin\left\{\theta_1 - \tan^{-1}\left(\frac{\gamma\sin\theta}{1 + \gamma\cos\theta}\right)\right\}$$

$$= \sqrt{1 + \gamma^2 + 2\cos\theta} \cdot \sin\theta_1 - \tan^{-1}\left(\frac{\gamma\sin\theta}{1 + \gamma\cos\theta}\right)$$

By dividing the above described equation (3) into an amplitude term and a phase term, the following equations (3a) and (3b) are obtained.

The amplitude term $A(t) = \sqrt{1 + \gamma^2 + 2\gamma\cos\theta}$ (3a)

The phase term $F(t) =$ (3b)

$$\sin\left\{\omega ct + m\cos\omega mt - \tan^{-1}\left(\frac{\gamma\sin\theta}{1 + \gamma\cos\theta}\right)\right\}$$

$$= \theta_1 - \phi = \theta_3$$

In the foregoing analysis was made in a mathematical manner and in the following a further description will be made with reference to the FIG. 2 vector diagram. Referring to the FIG. 2 vector diagram, it would be appreciated that the amplitude term $A(t) = \sqrt{1 + \gamma^2 + 2\gamma\cos\theta}$ of the above described equation (3a) is a scaler of the direct wave $e_1$ and the reflected wave $e_2$. By analyzing θ in the equation (3a) in a vector manner, the above described θ is given by the following equation (4).

$$\theta = \theta_1 - \theta_2 = \omega c\tau - 2m\sin\frac{\omega m\tau}{2} \sin\omega m\frac{t-\tau}{2} \quad (4)$$

From the above description equation (4), it would be appreciated that θ will vary depending on the modulation index m, the modulation angular frequency ωm and the delay time τ and a scaler of the composite wave e will vary depending on the reflected amount γ and cos θ. Accordingly, cos θ is varied depending on the modulation index m, the modulation angular frequency ωm and the delay time τ and a scaler of the composite wave e ($=e_1+e_2$) is fluctuated, whereby a noise and distortion are caused to occur.

Now it would be readily understood by referring to the FIG. 2 vector diagram that the phase term of the above described equation (3b) becomes $F(t) = \theta_1 - \phi = \theta_3$. If $\theta_3 = \theta_1$, then no distortion occurs, but since $\theta_3 = \theta_1 - \phi$ has been reached, a distortion due to the above described phase difference φ is caused to occur. In the foregoing, a description was made of occurence of a noise and distortion on the occasion of the direct wave $e_1$ and the reflected wave $e_2$.

FIG. 3 is a circuit diagram showing one example of the present invention. An FM receiver 1 is structured as a so-called car stereo FM receiver. An FM electric wave is received by an antenna 3 and is applied to an FM front end 5. The FM front end 5 comprises a high frequency amplifier, a local oscillator, a frequency converter, and the like, as well-known, and the output therefrom is obtained as an intermediate frequency signal. The intermediate frequency signal obtained from the FM front end 5 is applied to an IF amplifier/detector 7. The IF amplifier/detector 7 may be implemented by an integrated circuit model LA1140 manufactured by Tokyo Sanyo Electric Co., Ltd., for example. A structure of the integrated circuit 7 is shown in FIG. 4. Referring to FIG. 4, the IF amplifier/detector 7 comprises an IF amplifier 71 of six stages, for example, adapted to receive the intermediate frequency signal from the FM front end 5. The output from the IF amplifier 71 is subjected to amplitude limitation by means of a limiter 72 and is applied to a quadrature detector 73 for the purpose of demodulation. The output from the detector 73 is applied through an FM muting amplifier 74 to a pulsive noise removing circuit 9 at the subsequent stage. On the other hand, the output of the IF amplifier 71 is subjected to level detection by a level detector 75 and the level detected output is applied to a signal intensity indicator 76 and is also applied to the terminal 7a of the circuit 7. The terminal 7a corresponds to a terminal of the integrated circuit, for example, the fifteenth terminal of the integrated circuit LA1140.

Figure 5:
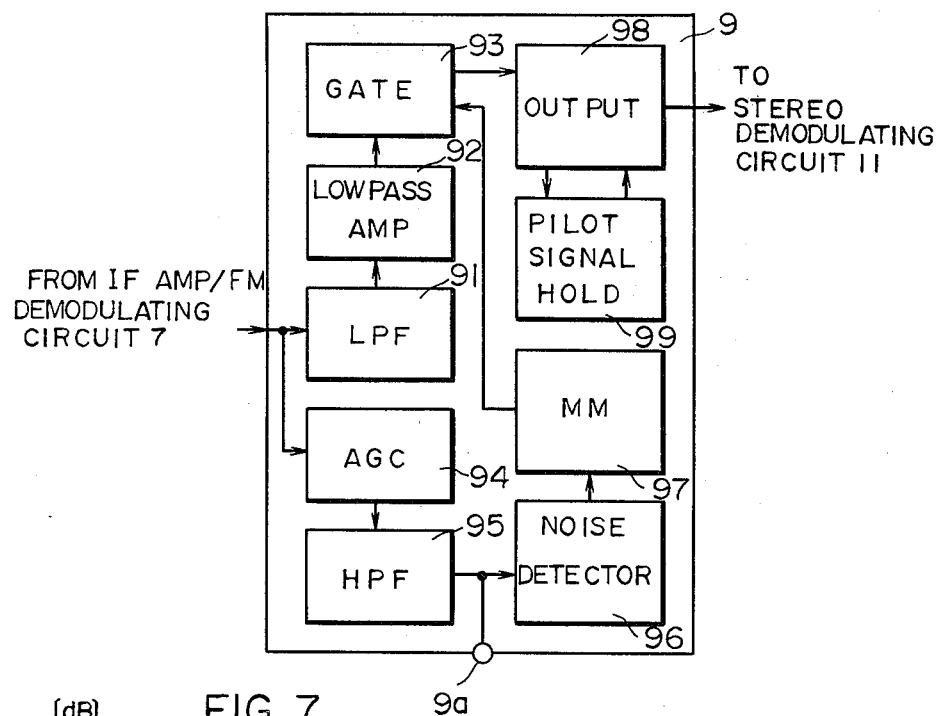
FIG. 5 is a block diagram showing in detail the pulsive noise removing circuit 9 in FIG. 3.

Returning to FIG. 5, the output of the IF amplifier/detector 7 is applied to the pulsive noise removing circuit 9. The pulsive noise removing circuit 9 may be implemented by an integrated circuit model LA2101 manufactured by Tokyo Sanyo Electric Co., Ltd., for example. A portion of the integrated circuit 9 (LA2101) is described in Japanese Patent Laying-Open No. 113602/1977 and U.S. Pat. No. 4,066,845 (Jan. 3, 1978). Now referring to FIG. 5, the pulsive noise removing circuit 9 will be briefly described. The demodulated signal obtained from the IF amplifier/demodulator 7 is applied through a low pass filter 91 and a low pass amplifier 92 to a gate circuit 93. On the other hand, the demodulated signal is applied further through an AGC circuit 94 to a high pass filter 95. The high pass filter 95 allows a high frequency region of the demodulated signal to pass therethrough and the output therefrom is applied to a noise detector 96 and is also applied to a terminal 9a. The noise detector 96 is responsive to the high frequency region signal to detect a noise (a pulsive noise), thereby to trigger a monostable multivibrator 97. The output of the monostable multivibrator 97 is applied to the above described gate circuit 93 as a gate control signal. Accordingly, the gate circuit 93 is responsive to the output of the monostable multivibrator 97 to gate the demodulated signal obtained through the low pass amplifier 92 and the output therefrom is applied to an output circuit 98. The output circuit 98 serves to provide the output to a stereo demodulating circuit 11 of the subsequent stage and is coupled to a pilot signal holding circuit 99. Meanwhile, the terminal 9a corresponds to a terminal of the integrated circuit, for example, the fourteenth terminal of the integrated circuit LA2101.

Returning again to FIG. 3, the output from the pulsive noise removing circuit 9, i.e. the output from the output circuit 98 is applied to the stereo demodulating circuit 11. The stereo demodulating circuit 11 may be implemented by an integrated circuit LA3370 manufactured by Tokyo Sanyo Electric Co., Ltd, for example. The stereo demodulating circuit 11 is responsive to the demodulated output from which a pulsive noise has been removed to provide a left signal and a right signal.

Figure 6:
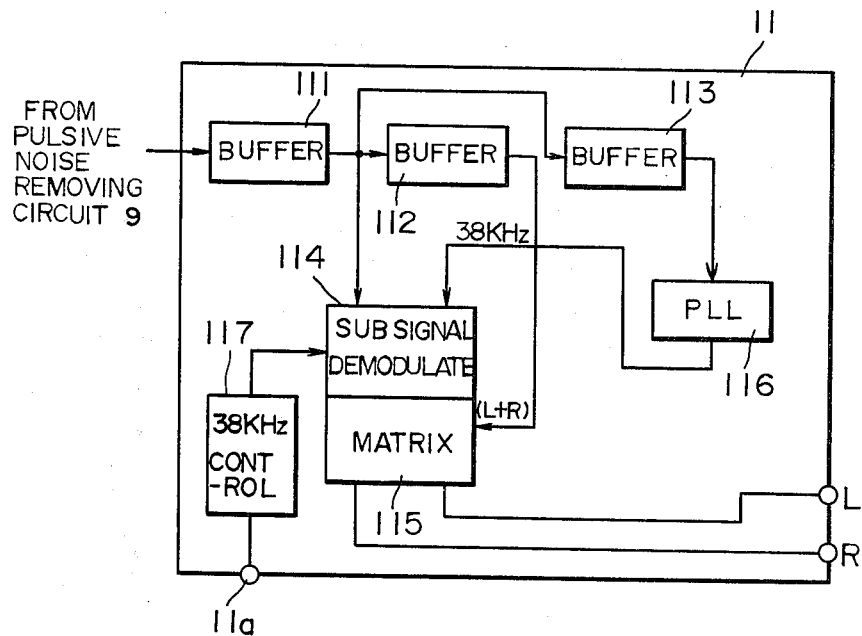
FIG. 6 is a block diagram showing in detail the stereo demodulating circuit shown in FIG. 3.

Now referring to FIG. 6, the stereo demodulating circuit 11 will be briefly described. The output from the pulsive noise removing circuit 9 is applied to the buffer 111 included in the stereo demodulating circuit 11. The output from the buffer 111 is applied to a subsequent buffer 112 as a stereo composite signal and is also applied to a subsignal [the difference signal (L−R)] demodulating circuit 114. The output of the buffer 112 is applied to a stereo matrix circuit 115 as a sum signal. The output of the buffer 113 is applied to a phase locked loop 116. The phase locked loop 116 extracts a stereo pilot signal of 19 kHz from the buffer 113 and provides a subcarrier of 38 kHz based on the stereo pilot signal. The subcarrier signal from the phase locked loop 116 is applied to a subsignal demodulating circuit 114. The stereo matrix 115 is responsive to the two applied signals i.e. the sum signal (L+R) and the difference signal (L−R) and the subcarrier signal to provide a left signal (L) and a right signal (R). Meanwhile, the circuit 11 is provided with a 38 kHz control circuit 117. The 38 kHz control circuit 117 controls the subcarrier signal (38 kHz) applied to the stereo matrix 115, thereby to control stereo separation. The 38 kHz control circuit 117 is supplied with a voltage signal from the terminal 11a. More specifically, the terminal 11a corresponds to a terminal of the integrated circuit, for example, the eighth terminal of the integrated circuit LA3370 and the stereo separation is changeable as a function of the magnitude of the voltage being applied to the terminal 11a. For example, the larger the voltage being applied to the terminal 11a, the better the stereo separation, whereas the smaller the voltage the worse the separation. Thus, if and when the voltage being applied to the terminal 11a is zero or the ground level, the output from the stereo matrix 115 becomes a complete monaural signal. Referring to FIG. 3, the left signal and the right signal are balance adjusted by means of a balancing variable resistor 13, so that the left signal is applied through a variable resistor 15 to a low frequency amplifier 19 and the right signal is applied through a variable resistor 17 to a low frequency amplifier 21. The low frequency amplifiers 19 and 21 are coupled to drive the corresponding speakers 23 and 25, respectively.

The terminal 9a of the pulsive noise removing circuit 9, i.e., the output of the high pass filter 95 is applied through a capacitor 201 to the base electrode of a transistor 203 serving as a gain element. The transistor 203 receives a bias voltage at the base electrode thereof from a voltage source +B and the collector electrode thereof is coupled through a resistor to the voltage source +B. The emitter electrode of the transistor 203 is connected through a switching transistor 205 and a resistor and a capacitor to the ground. The base electrode of the switching transistor 205 is connected by a line 205a through a voltage dividing circuit including resistors 7b and 7c to the terminal 7a of the IF amplifier/demodulator 7, i.e. the output of the level detector 75.

The collector electrode of the transistor 203 is further connected through a double voltage rectifying circuit 207 including capacitors 209 and 215 and diodes 211 and 213 to the base electrode of a transistor 217. The collector electrode of the transistor 217 is connected to the voltage source +B and the emitter electrode thereof is connected through a resistor 219 to the ground. At the same time, the emitter electrode of the transistor 217 is connected through a series connection of a diode 221 and a resistor 225 to the base electrode of a switching transistor 229 and further through a series connection of the diode 221 and a resistor 227 to the base electrode of a switching transistor 231. The junction of the diode 221 and the resistors 225 and 227 is connected through a capacitor 223 to the ground. Thus the capacitor 223 constitutes a charging/discharging circuit. The collector electrode of the switching transistor 229 is coupled through a capacitor 233 to the left signal output of the stereo demodulating circuit 11 and the emitter electrode thereof is connected to the ground. Similarly, the collector electrode of the switching transistor 231 is coupled through a capacitor 235 to the right signal output of the stereo demodulating circuit 11 and the emitter electrode thereof is connected to the ground.

Figure 7:
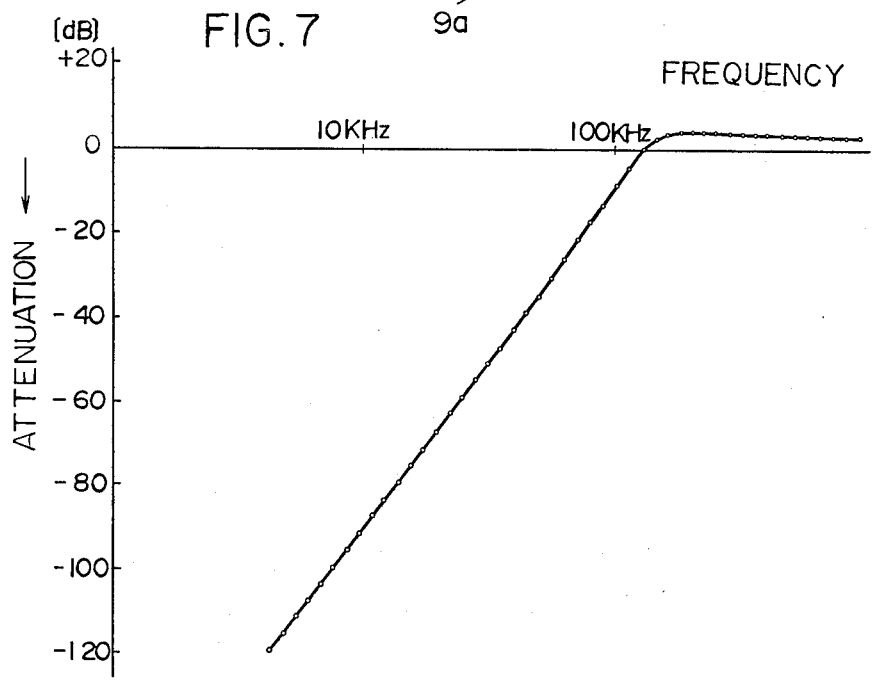
FIG. 7 is a graph showing a characteristic of the high pass filter 95, wherein the abscissa indicates the frequency and the ordinate indicates the attenuation amount.

As described previously, the output of the high pass filter 95 included in the pulsive removing noise 9 is applid to the base electrode of the transistor 203. The high pass filter 95 performs an inherent function in the pulsive noise removing circuit 9 but also performs, in the embodiment shown, a function for detecting a higher harmonic level of a distortion component. Accordingly, in case of an FM receiver not including a pulsive noise removing circuit 9, naturally a separate indepinding high pass filter may be provided. The reason why the high pass filter 95 is used for the purposes of two circuits as in the case of the embodiment shown is that, since the output impedance of the fourteenth terminal of the integrated circuit LA2101 is small, withdrawal of a further signal therefrom exerts no influence upon the characteristic of the circuit 9 and also attains economy. One example of the characteristic of the high pass filter is shown in FIG. 7. If a separate independent high pass filter is provided which has a good characteristic, i.e. an abrupt attenuation, performance of distortion detection to be described would be enhanced accordingly. Meanwhile, a cutoff frequency of the high pass filter 95 is selected to be approximately 100 kHz.

Too high a cutoff frequency makes it impossible to detect distortion with a sufficient accuracy, while too low a cutoff frequency could cause erroneous detection. Accordingly, a cutoff frequency of the high pass filter need be properly selected. Now description will be made of the fact that distortion can be detected by the use of the high pass filter.

By analyzing a periodical function wave including distortion, the same can be represented in the form of a Fourier series, as shown by the following equation (5) as well-known to those skilled in the art.

$$y = a_0 + A_1\sin(\omega t + \phi_1) + A_2\sin(2\omega t + \phi_2) + \quad (5)$$

$$A_3\sin(3\omega t + \phi_3) + \ldots + A_n\sin(n\omega t + \phi_n)$$

$$= a_0 + \sum_{n=1}^{\infty} A_n\sin(n\omega t + \phi_n)$$

Furthermore, it is well known that the definition of a distortion ratio is represented by the following equation:

$$D = \frac{\sqrt{\sum_{n=2}^{\infty} A_n^2}}{A_1} \times 100[\%]. \quad (6)$$

As seen from the above described equation (6), the harmonic level as such is proportional to the distortion rate D. Accordingly, the output of the high pass filter 95 is associated with the distortion rate. Therefore, by using the output of the high pass filter 95 as a distortion detected signal, the same can be used in applications other than reduction of a noise and distortion to be described subsequently. For example, although not shown, a distortion amount can be accurately displayed, by providing an amplifier connected to receive the output of the high pass filter 95 as an input thereto, a rectifying circuit connected to receive the output of the amplifier, and a display circuit including a display connected to receive the output of the rectifying circuit.

Now a description will be made of a charging/discharging circuit including a capacitor 223 which is one of the features of the present invention. A charging path of the capacitor 223 is constituted by +B-transistor 217-diode 221. Accordingly, a resistance component on the circuit associated with the charging time constant is an internal resistance of the respective elements. Furthermore, on the occasion of discharging of the capacitor 223, a reverse resistance ($R_{221}$) of the diode 221, the resistor 225 ($R_{225}$), the base-emitter resistance ($R_{BE}$) of the transistor 229, the resistor 227 ($R_{227}$) and the base-emitter resistance ($R'_{BE}$) of the transistor 231 each function in a parallel manner. Therefore, a relation of the reverse resistance ($R_{221}$) of the diode 221 and other resistance components is expressed by the following equation (7).

$$R_{221} > \frac{(R_{225} + R_{BE}) \times (R_{227} + R'_{BE})}{(R_{225} + R_{BE}) + (R_{227} + R'_{BE})} \quad (7)$$

Figure 8:
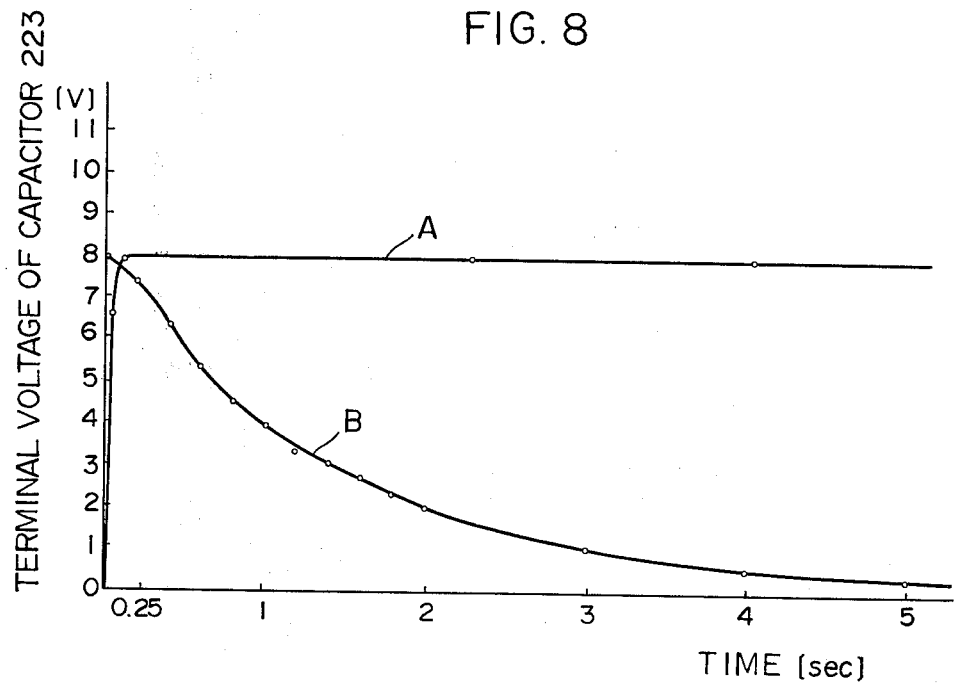
FIG. 8 is a graph showing a charging/discharging characteristic of the capacitor 223, wherein the abscissa indicates the time and the ordinate indicates the terminal voltage, the curve A showing the charging characteristic and the curve B showing the discharging characteristic.

Now assuming that the resistance values ($R_{225}$) and ($R_{227}$) of the resistors 225 and 227 ae each 56KΩ, and the base-emitter resistance $R_{BE}$ of the transistor 229 and the base-emitter resistane $R'_{BE}$ of the transistor 231 are equal to each other, then the right term of the above described equation (7) becomes (56/2) kΩ+$R_{BE}$ and, since the resistance $R_{BE}$ when the transistors 229 and 231 are in a conductive state is extremely small as compared with 56kΩ, the right term of the above described equation (7) becomes approximately 28 kΩ. Accordingly, the discharging time constant of the discharging path of the capacitor 223 becomes extremely large as compared with the charging time constant of the charging path. Now specifically, the charging/discharging characteristic of the capacitor 223 is as shown in FIG. 8. Referring to FIG. 8, the curve A shows the charging characteristic and the curve B shows the discharging characteristic. Referring to the curve B showing the discharging characteristic, it is seen that as compared with the characteristic in an ordinary case of the resistor and the capacitor the curve long continues as the time passes. The reason is that the base-emitter resistances $R_{BE}$ and $R'_{BE}$ of the transistors 229 and 231 become larger as the base voltage becomes lower. However, the above described characteristic has no influence upon the switching characteristic, i.e. the recovery time of the transistors 229 and 231 and rather assists a quick response in the case where distortion occurs continuously.

Figure 9:
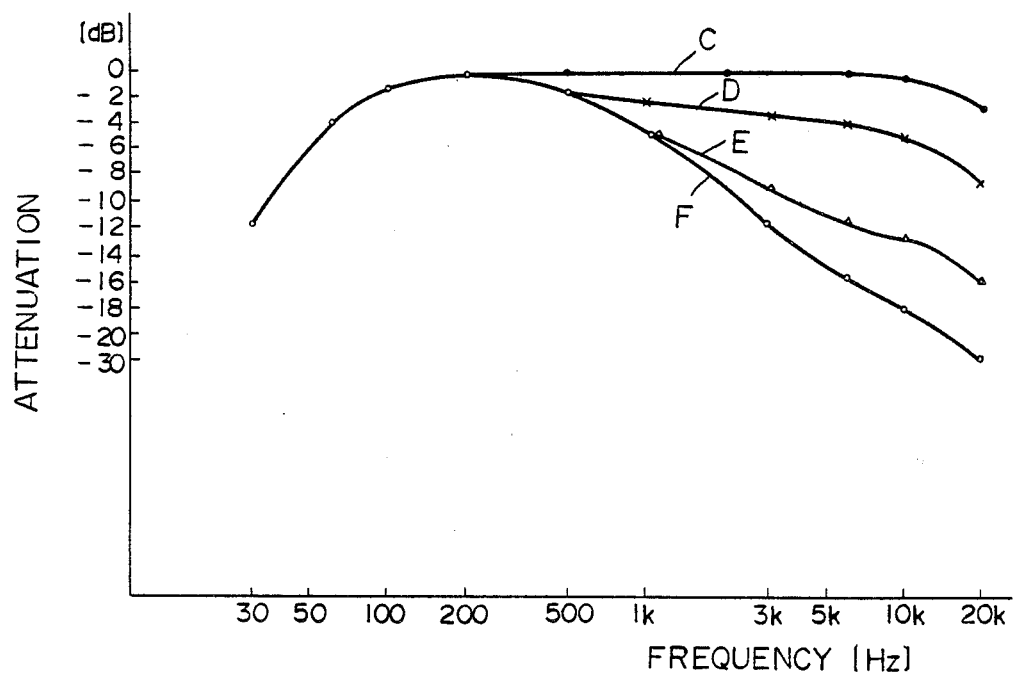
FIG. 9 is a graph for explaining the effect for reducing the higher frequency region in the FIG. 3 embodiment, wherein the abscissa indicates the frequency and the ordinate indicates the attenuation amount, the curve C showing a case substantially in absence of a noise or distortion and the curves D, E and F showing cases where a noise and distortion become larger in succession.

Now that a structure was described in the foregoing, an operation will be described in the following with reference to FIG. 9.

In operation, a case in the presence of multi-path distortion will be described. A composite wave (FIG. 2) of an FM electric wave coming through the antenna 3 is transferred through the FM front end 5 and is demodulated by the IF amplifying/demodulating circuit 7 with distortion contained and the output is applied to the pulsive noise removing circuit 9. The demodulated signal containing distortion applied to the circuit 9 passes through the high pass filter 95 and withdrawn from the terminal 9a of the circuit 9. The larger the distortion (the distance rate) contained in the demodulated signal or the higher the demodulated frequency (Ωm), the larger the output level of the high pass filter 95.

The output of the high pass filter 95 is applied through the capacitor 201 to the base electrode of the transistor 203 and is amplified by the transistor 203. However, it is when the switching transistor 205 is in a conductive state, i.e. when the voltage at the terminal 7a of the IF amplifying/demodulating circuit 7 is the high level. Meanwhile, the switching operation of the transistor 205 will be described subsequently. A noise and distortion component amplified by the transistor 203 is rectified by the double voltage rectifying circuit 207 and the output thereof is applied to the base electrode of the switching transistor 217. The switching transistor 217 becomes conductive when the output voltage of the double voltage rectifying circuit 207 exceeds a predetermined value, at which time a current flows from the voltage source +B. The current flowing through the transistor 217 is applied to the capacitor 223 (say 47 μF), thereby to rapidly charge the same in accordance with the charging characteristic shown by the curve A in FIG. 8. When the charging voltage of the capacitor 223 reaches a predetermined value, the switching transistors 229 and 231 become conductive at the same time. Accordingly, the capacitor 233 is inserted between the signal output of the output of the stereo demodulating circuit 11 and the ground, while a capacitor 235 is interposed between the right signal output and the ground. Therefore, a high frequency component in the output of the stereo demodulating circuit 11 is reduced. Meanwhile, by properly selecting the values of the capacitors 233 and 235, a high frequency can be fully cut, and furthermore a muting operation can be also performed. Thus a high frequency region of the respective signals being applied to the lower frequency amplifiers 19 and 21 is reduced and an adverse influence exerted upon the auditory sense by a noise and distortion can be mitigated.

Now a case where little or no distortion is contained in the demodulated signal will be described. In such a case, the output voltage of the high pass filter 95 obtained at the terminal 9a of the circuit 9 becomes approximately zero. Since the output of the high pass filter 95 being approximately zero does not reach the level for rectification by the diodes 211 and 213 of the double voltage rectifying circuit 207 even if the same is amplified by the transistor 203, the switching transistor 217 becomes non-conductive. Accordingly, the transistors 229 and 231 both become non-conductive without a charging current being applied to the capacitor 223. Therefore, the capacitors 233 and 235 are interrupted from the ground and the above described operation for reducing a high frequency component is not performed.

In the case where an FM receiver is borne on a vehicle, the above described multi-path distortion fluctuates instantaneously in proportion to the speed of the vehicle. Therefore, a quick response is required to a change from a state in the absence of distortion to a state in the presence of distortion, whereas a delay characteristic is required to a change from a state in the presence of distortion to a state in the absence of distortion. The reason is that it is necessary to attain natural recovery. More specifically, in the case of a change from a state in the presence of distortion to a state in the absence of distortion, release of reduction of a higher frequency reason in quick response thereto instantaneouly increases a signal being applied to the lower frequency amplifiers 19 and 21, which causes a noise offensive to the ears from the stand point of the auditory sense. Accordingly, the embodiment shown has been adapted such that the charging time constant of the charging path and the discharging time constant of the discharging path of the capacitor 223 are selected to be different from each other, whereby the charging/discharging characteristic is set as shown in FIG. 8. Therefore, since the embodiment is adapted such that an influence exerted upon the auditory sense by a noise and distortion is mitigated immediately upon occurrence of distortion while natural recovery is attained with a delay time on the occasion of a change to a state in the absence of distortion in the demodulated signal, little auditory sensation of incompatibility is caused because of these additional circuits.

Now referring to FIG. 9, description will be made of how much effect of reducing a higher frequency region is afforded to a low frequency signal being applied to the low frequency amplifiers 19 and 21 by the magnitude of the output level of the high pass filter 95 (which is associated with the magnitude of distortion as described previously). At the outset, it follows that the effect of reducing a higher frequency region in the low frequency signals is changeable by $R_A$ (=the impedance between the variable resistor 15 or 17 of the low frequency signal and the ground), $R_B$ (=the emitter-collector impedances of the transistors 229 and 231) and $C_A$ (=the capacitance values of the capacitors 233 and 235).

Let it be assumed that based on FIG. 3 the impedance of $R_B+(1/j\omega C_A)$ is connected in parallel with the impedance $R_A$ and the impedance $R_B$ is varied from the value $R_a$ to $R_b$. However, it is assumed that the value $R_a$ is the impedance in the case where the transistors 229 and 231 are in a full non-conductive state, i.e. no distortion exists at all. It follows that the impedance $R_A$ is shunted by the output impedance of the stereo demodulating circuit 11, the impedances of the variable resistors 15 and 17 and the impedance of the variable resistor 13 and the like, so that the impedance $R_A$ becomes sevveral k$\Omega$. On the other hand, the above described value $R_a$ is several 100k$\Omega$. Therefore, even if $R_a+(1/j\omega C_A)$ is added to the impedance $R_A$, the overall impedance Z becomes approximately equal to the impedance $R_A$. More specifically, it follows that the effect for reducing a higher frequency region in the low frequency signals is not performed and as a result the frequency characteristic of the low requency signals is shown by the curve C in FIG. 9.

Now assuming that the above described value $R_b$ is the impedance when the transistors 229 and 231 are fully conductive, then the overall impedance Z is expressed by the following equation (8).

$$Z = \frac{R_A \left( R_b + \frac{1}{j\omega C_A} \right)}{R_A + \left( R_b + \frac{1}{j\omega C_A} \right)} \tag{8}$$

Full conduction of the transistors 229 and 231 means that the above described value $R_b$ approximates zero and the equation (8) is expressed by the following equation (8') in an approximate manner.

$$Z = \frac{\frac{R_A}{j\omega C_A}}{R_A + \frac{1}{j\omega C_A}} \tag{8'}$$

More specifically, the effect for reducing a higher frequency region in the lower frequency signals is expressed by the following equation:

$$\text{Attenuation amount} = 20 \log (R_A/Z) \text{ [dB]} \tag{9}$$

Referring to the equation (9) the overall impedance Z is a function of the frequency (f) and accordingly the attenuation amount in the arbitrary frequency is known. The effect for reducing a higher frequency region is such a situation where the switching transistors 229 and 231 are fully conductive is shown by the curve F in FIG. 9. When it is desired that the attenuation amount in the higher frequency region is increased to be larger than the curve F, it would be sufficient to select the values of the capacitancess ($C_A$) of the capacitors 233 and 235 to be larger. As shown in FIG. 9, in the total absence of distortion, an ordinary frequency characteristic as shown by the curve C is attained, whereas the impedance $R_B$ is gradually decreased as distortion increases, so that the frequency characteristic changes as shown by the curve D or the curve E or the curve F.

Meanwhile, referring to the FIG. 3 embodiment, adjustment of the sensitivity of the circuit with respect to a noise and distortion can be set by properly adjusting the amplification gain by the transistor 203.

Now an operation of the switching transistor 205 will be described. The transistor 205 is provided for the purpose of preventing malfunction.

Figure 10:
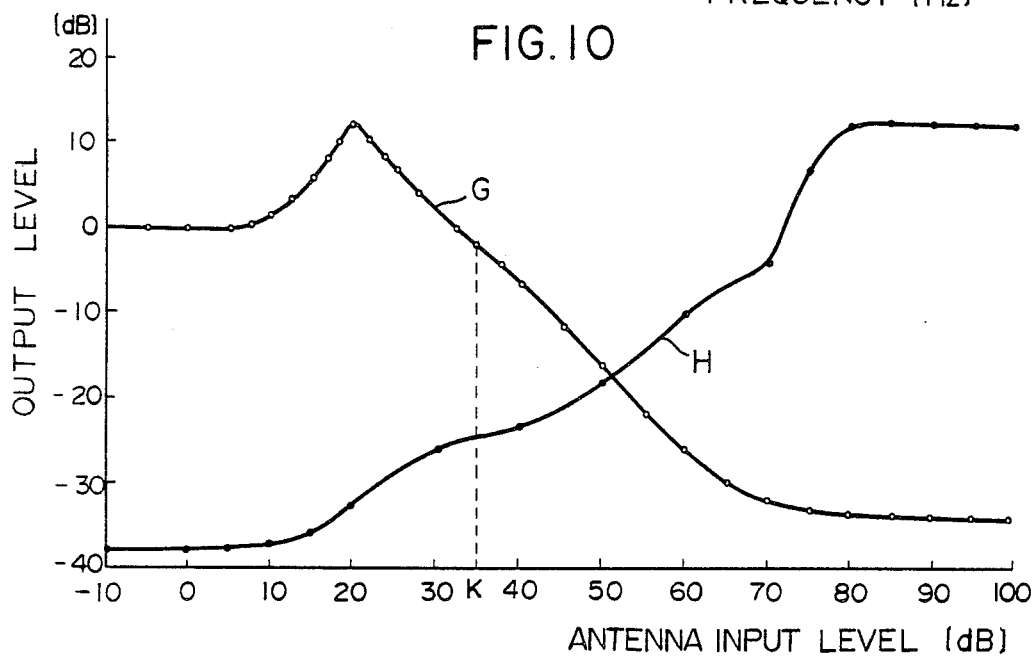
FIG. 10 is a graph showing the output level of the high pass filter 95 and the output level of the level detector 75 with respect to the antenna input level (abscissa), the curve G showing the output level of the high pass filter 95 and the curve H showing the output level of the level detector 75.

FIG. 10 is graph showing the input level of the antenna 3 and the output level of the high pass filter 98 and the output level of the level detector 75. Referring to FIG. 10, the curve G shows the output level of the high pass filter 95 and the curve H shows the output level of the level detector 75. As seen from the curve G, the white noise increases as the antenna input becomes small. Since the white noise includes a high frequency level sufficient enough to pass through the high pass filter 95, assuming the absence of the switching transistor 205 shown in FIG. 3, the transistors 229 and 231 become a conductive state, when the antenna input is small or in the absence of the input signal, whereby an operation for reducing the higher frequency region is performed. Accordingly, the embodiment shown is adapted such that the switching transistor 205 becomes conductive whenever the antenna input exceeds a given level, whereby the transistor 203 and thus the transistor 217 is enabled.

Figure 11:
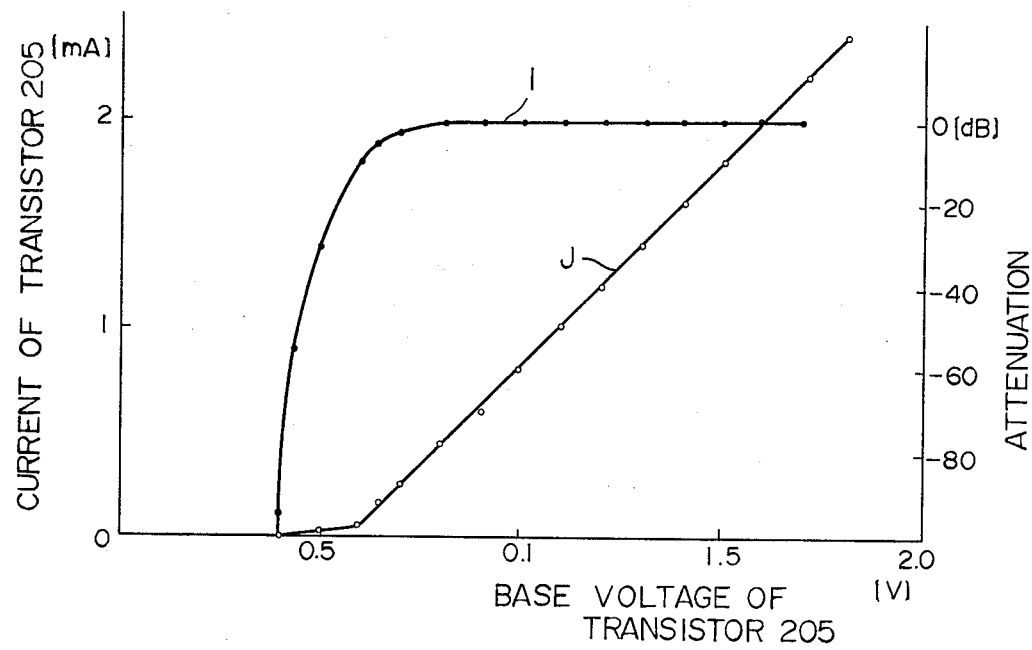
FIG. 11 is a graph for explaining the operation of the switching transistor 205, wherein the abscissa indicates the base voltage of the transistor 205 and the ordinate indicates the current and the attenuation amount, the curve I showing the collector current characteristic of the transistor 203 and the curve J showing the gain characteristic of the transistor 203.

FIG. 11 shows the collector current characteristic and gain characteristic of the transistor 203 with respect to the curve 205a, i.e. the base voltage of the transistor 205. Referring to FIG. 11, the curve I shows the current characteristic and the curve J shows the gain characteristic. According to a given embodiment, the transistor 203 comes to be conductive when the base voltage of the transistor 205 becomes approximately 0.4 V and becomes in a full conductive state when the base voltage becomes approximately 0.6 V, as shown by the curve J in FIG. 11. Accordingly, an arbitrary antenna input level is selected based on the output level of the level detector 75 shown by the curve H in FIG. 10 and the arbitrary point such as the point K is determined, and the values of the resistors $7_b$ and $7_c$ shown in FIG. 3 are selected such that the switching transistor 205 may become conductive when the base voltage exceeds the above described point K. By doing so, it follows that the transistor 203 and thus the transistor 217 is enabled whenever an arbitrary antenna input level such as the point K is exceeded.

Figure 12:
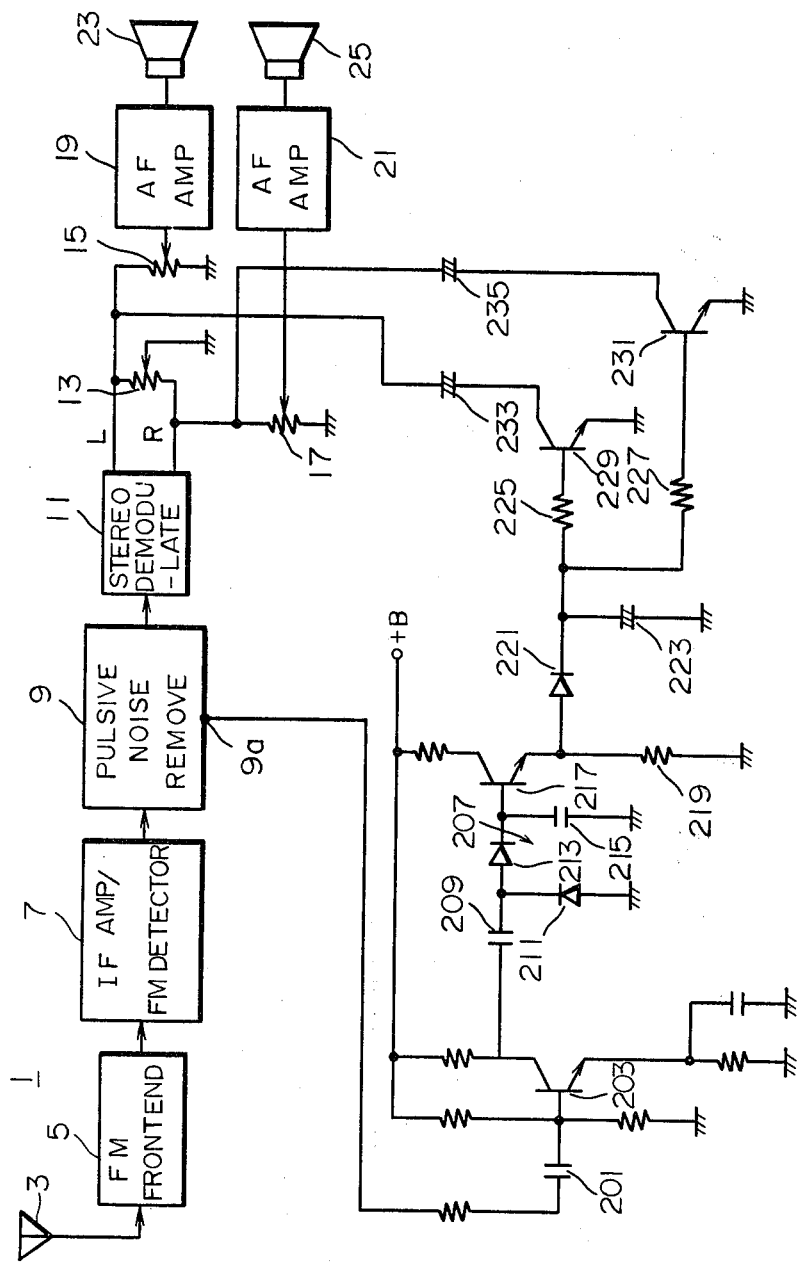
FIG. 12 is a schematic diagram showing another embodiment of the present invention.

Meanwhile, in some case a circuit associated with the switching transistor 205 is not necessarily required. More specifically, if and when an attempt is made to mitigate even an influence by a noise caused because of a fluctuation of an electric wave intensity in accordance with a Rayleigh distribution in a weak electric field area, a circuit associated with the switching transistor 205 is not required. More specifically, in such a case, the switching transistor 205 and the line 205a and the resistors $7_b$ and $7_c$ are removed, as shown in FIG. 12, so that the emitter electrode of the transistor 203 is connected directly through a resistor or a capacitor to the ground.

The electric field strength in a weak electric field area is in accordance with a Rayleigh distribution, as described previously. Therefore, an antenna input level of an FM receiver borne on a vehicle varying in that area fluctuates in accordance with the above described distribution, so that a noise is generated for each fluctuation. Therefore, by operating the circuit for reducing a higher frequency component in the low frequency signals in the level smaller than the antenna input level where a noise is generated because of the Rayleigh distribution, even if a noise is generated based on a fluctuation of the electric field strength because of such Rayleigh distribution, an influence caused by such noise is mitigated, whereby reception can be made with a little auditory sensation of incompatibility. For example, assuming that an influence by a noise because of the Rayleigh distribution comes to be generated in the level lower than the antenna input level of the point K in FIG. 10, then the base of the transistor 203 may be set so that the transistor 217 may become conductive at the point K. Then, even if a noise occurs because of the Rayleigh distribution in the antenna input level smaller than the point K, the higher frequency region is reduced by the capacitors 233 and 235 and an influence becomes very little. Furthermore, the lower antenna input level, the larger the effect is attained. The reason is that the lower the antenna input level the larger the white noise and thus the larger the output of the high pass filter 95.

Thus, according to the embodiment where the circuit associated with the switching transistor 205 in FIG. 3 is removed, the magnitude of a noise because of a variation of the electric field strength based on the Rayleigh distribution and the magnitude of the white noise in the case where the antenna input level becomes small to some extent in the weak electric field area, and the magnitude of the distortion and noise when the composite wave involves a noise and distortion because of a multi-path interference in the middle or strong electric field areas is accurately and automatically detected, whereby an operation for reducing a higher frequency region is performed in accordance with the respective magnitudes of the white noise, distortion and the like. Accordingly, in such a case, no sense of incompatibility is given to listeners. When the magnitude of the white noise, noise or distortion becomes small, the effect of reducing a higher frequency region is naturally released and recovery is made naturally, and as a result a more effective noise and distortion mitigating circuit is provided.

Furthermore, according to the above described embodiment, multi-path distortion can be detected with more accuracy as compared with the conventional detecting circuit.

Depending upon the fact that distortion factor is proportional to variations in carrier amplitude when multi-path distortion occurs, the conventional multi-path distortion detector introduces an DC output from a level detector (i.e., a DC output driving a signal level indicator) responsive to an intermediate frequency (IF) signal into a differentiation circuit to extract the variations in carrier amplitude. After being AC-amplified and detected, the variations in carrier amplitude are derived in the form of a DC output as a detection output indicative of multi-path distortion. Consideration is given to the detection accuracy of such a multi-path distortion detector. While the detector output is precisely proportional to multi-path distortion as long as distortion is high, there is incapability of detecting multi-path distortion within a small distortion region. This is due to the fact that variations in propagation of radio signals in the air and variations in degree of modulation makes it difficult to distinguish only multi-path distortion from other signal components in the case where multi-path distortion is small. In other words, it is impossible to distinguish 0.01% distortion even when it is amplified up to about 0.5% in hifi FM stereo receivers or the like for home use. Those receivers are unable to detect distortion unless distortion factor is considerably degraded.

In addition, in the case where multi-path distortion is fixed, the output of the multi-path distortion detector responsive to the input (electric field strength) to the antenna increases due to random noise when the antenna input is below a given level (say, less than about 5 dB). As a matter of fact, the detector will make erroneous decision as if distortion is deteriorated despite fixed multi-path distortion. This is problem based on the sensitivity of the receivers rather than multi-path distortion. On the other hand, if the antenna input is above a given level (say, 60 dB), then the DC output of the level detector responsive to the IF signal will become saturated and the carrier amplitude is limited. In this case, the detector senses as if distortion is improved despite fixed multi-path distortion. By contrast, the above described emdobiment provides reduction of multi-path distortion and an accurate and effective display of the magnitude of multi-path distortion by leading the output of the FM demodulator to the high pass filter whose output is utilized as the multi-path distortion detecting signal and converted into its corresponding DC signal as the output signal indicative of multi-path distortion.

Depending upon the fact that multi-path distortion appearing as noise is significantly greater when in stereo receiver mode than when in monaural receiver mode, multi-path distortion is further suppressed by forcedly altering operation mode from stereo receiver mode to monaural receiver mode together with reduction of the treble region of the low frequency signal when multi-path distortion appears as noise.

Figure 13:
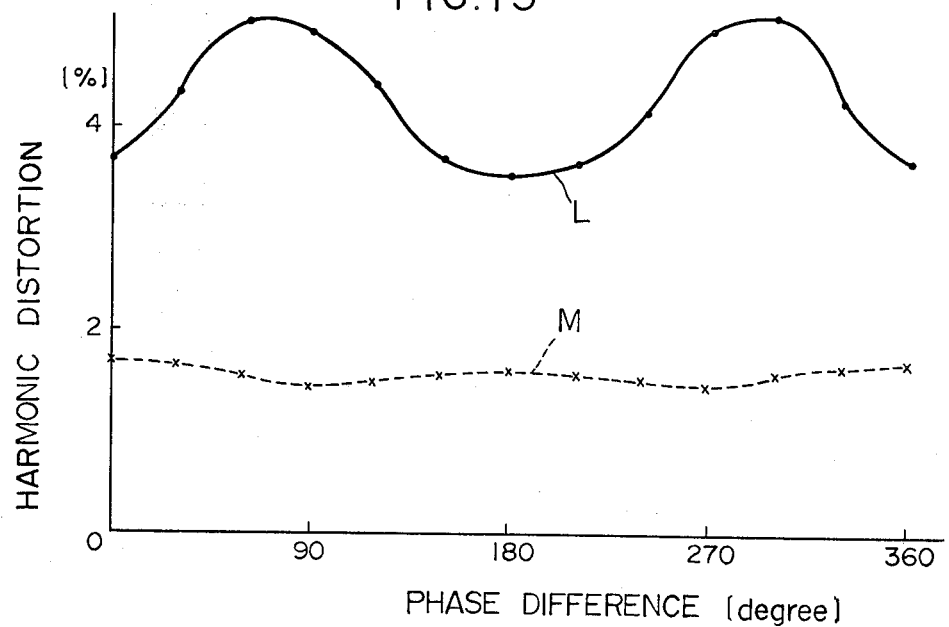
FIG. 13 is a graph showing a relation between the high frequency distortion (ordinate) with respect to the phase difference (abscissa), wherein the curve L shows the relation on the occasion of stereo reception and the curve M shows a relation on the occasion of monaural reception.
Figure 15:
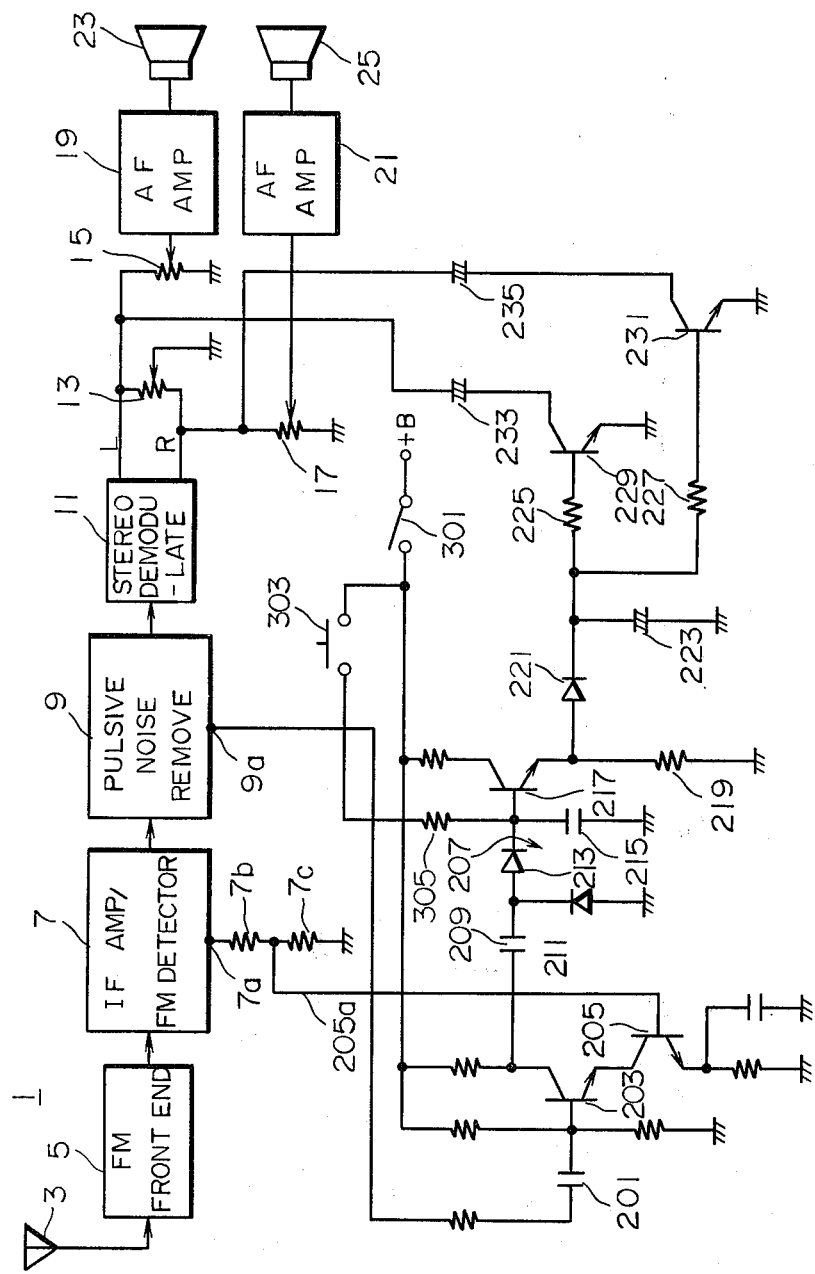
FIGS. 15 and 16 are schematic diagrams of still further embodiments of the present invention, respectively.

In particular, the following will set forth how much multi-path distortion differs between in FM stereo receiver mode and in monaural receiver mode by reference to the graph of FIG. 13. For instance, distortion factor is monaural receiver mode was no more than 1.5% with 100% modulation, 3 KHz, 10 dB of DU ratio (desired-to-undesired signal ratio), 10 μsec of delay time and 60° of phase difference. On the other hand, distortion factor amounted to 5.5% in monaural receiver mode. This suggests that, provided that multi-path distortion occurs under the above-mentioned conditions and the receiver is in stereo receiver mode, distortion factor can be reduced from 5.5% to 1.5% by forcedly placing the receiver into monaural receiver mode. In the graph of FIG. 15, the line L represents characteristics in stereo receiver mode (only left signals) and the line M those in monaural receiver mode.

With the following embodiments in mind, it is an object of the present invention to ensure a further reduction in multi-path distortion by provision of means for forcedly placing a receiver into a monaural receiver mode upon the development of multi-path distortion. A specific embodiment will be described by reference to FIG. 14.

Figure 14:
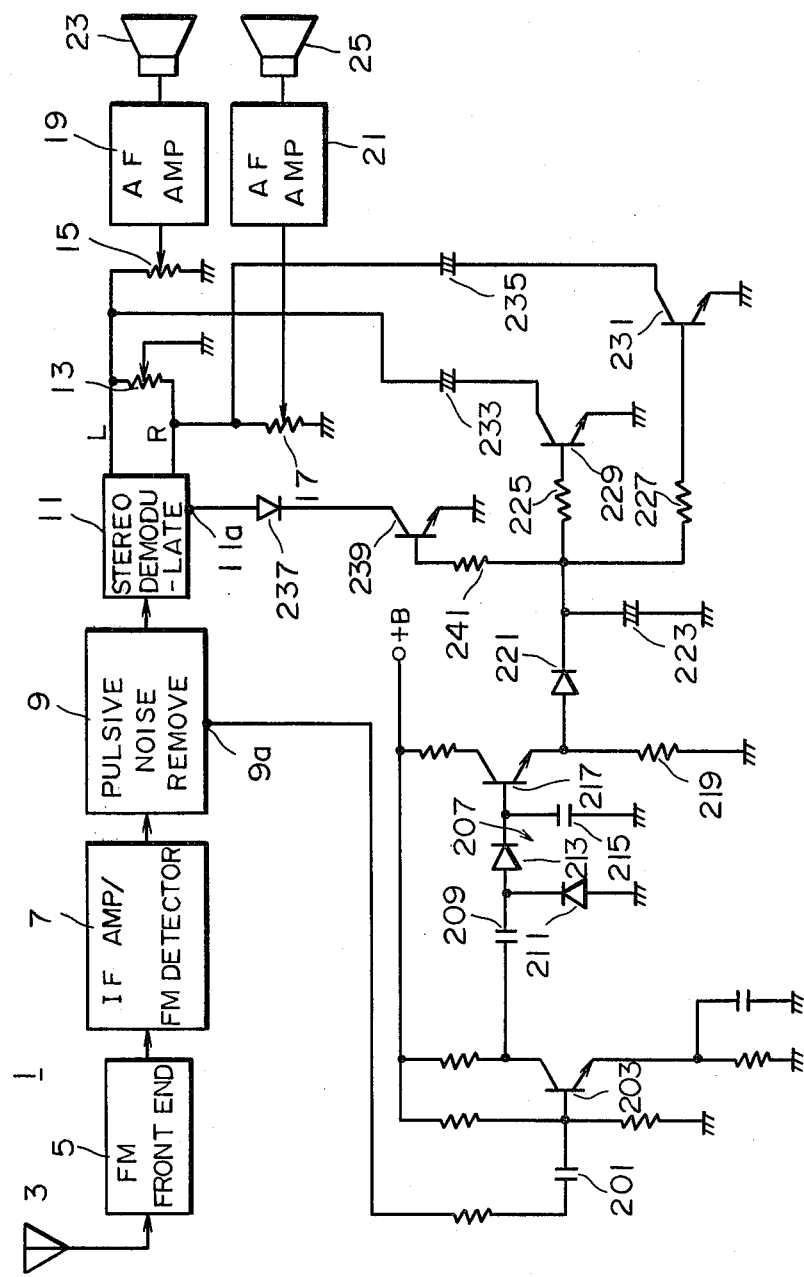
FIG. 14 is a schematic diagram of still a further embodiment of the present invention.

In FIG. 14, the same parts as in FIG. 3 are represented by the same reference numbers.

In the circuit of FIG. 14, the receiver is forcedly brought into monaural receiver mode with 0 dB of separation by grounding a left and right signal separation adjusting terminal 11a of integrated circuit LA3370 constituting the FM stereo demodulator 11 (that is, it corresponds to terminal 8 of LA3370).

More particularly, provided between the terminal 11a of integrated circuit LA3370 forming the FM stereo demodulator 11 and ground in the circuit of FIG. 14 is a series circuit of a diode 237 and a collector-to-emitter path of a switching transistor 239 of which the base is connected to one terminal (non-grounded terminal) of the capacitor 223 through a resistor 241. The remaining circuit arrangement is identical with that in FIG. 3.

Operation of the above described circuit of FIG. 14 will now be discussed. When multi-path distortion occurs in stereo receiver mode, the capacitor 223 is quickly charged and the switching transistors 229 and 231 become conductive in a way similar to that in FIG. 3, thus attenuating the treble region of the output of the FM stereo demodulator 11. At this moment the switching transistor 239 also becomes conductive and the terminal 11a of integrated circuit LA3370 constituting the FM stereo demodulator 11 is grounded via the diode 237. Consequently, the receiver is forced into monaural receiver mode with a minimum of multi-path distortion which is harsh and disagreeable to the listener's ear.

Contrarily, when little or no multi-path distortion occurs, the switching transistors 229 and 231 become non-conductive as shown in FIG. 3 to inhibit attenuation of the treble region of the output of the FM stereo demodulator 11. Since the switching transistors 239 is in non-conductive state under these circumstances, the FM stereo demodulator 11 persists in the normal stereo receiver mode rather than in monaural receiver mode. As noted earlier, the distortion reduction circuit for use in FM receivers according to the embodiments, insures a further reduction in distortion by provision of the additional means for the receiver forcedly altering the receiver from stereo receiver mode into monaural receiver mode upon the development of multi-path distortion.

Figure 16:
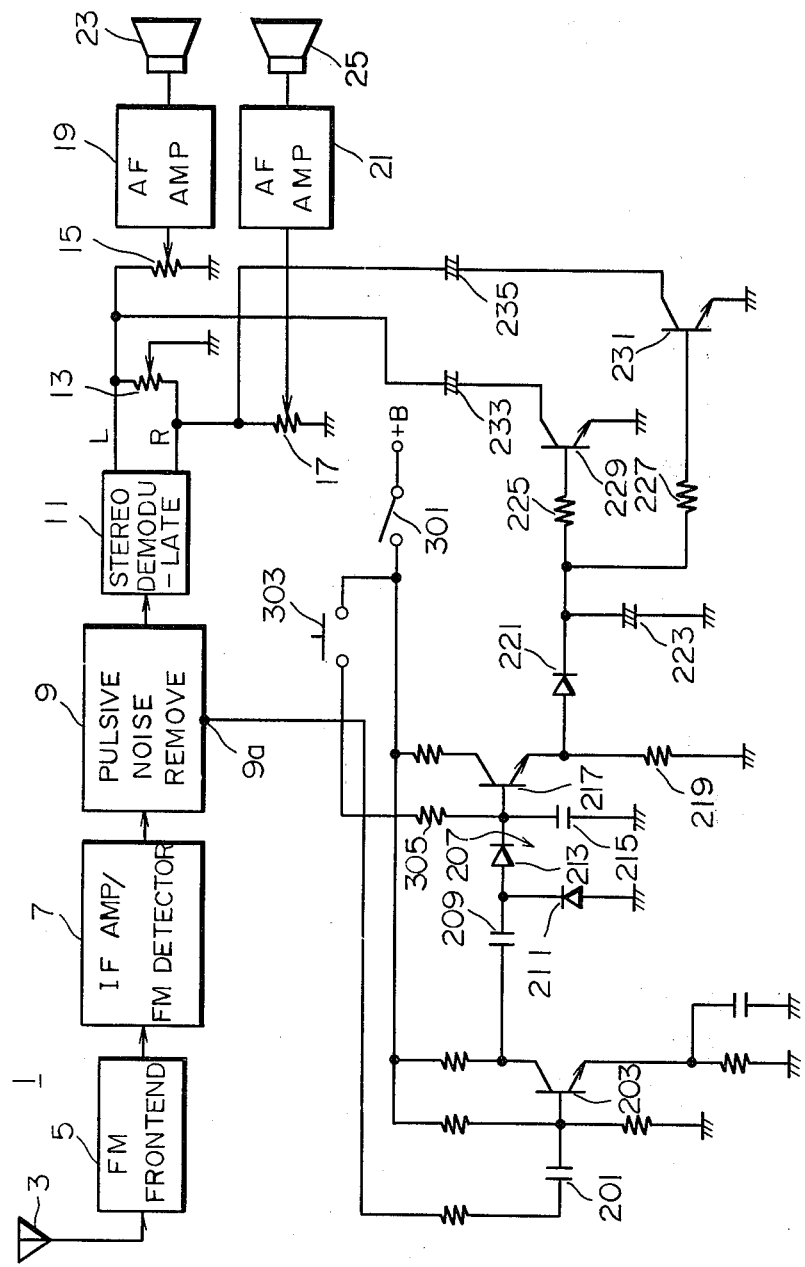

FIGS. 15 and 16 are schematic diagrams of further embodiments of the present invention, respectively. In these embodiments, the FM receiver 1 is combined with a cassete type tape recorder, not shown. Meanwhile, the FIG. 15 embodiment corresponds to the previously described FIG. 3 embodiment and the FIG. 16 embodiment corresponds to the previously described FIG. 12 embodiment.

In addition to the previously illustrated arrangement of FM radio receivers 1, circuits of FIGS. 15 and 16 further include a switch 303 and a resistor 305 serially connected between the power supply +B and the base of the switching transistor 217. The switch 303 is adapted to be operative only when the equipment is switched from tape recorder mode to radio mode and in other words only when a tape/radio selection and ejection button is depressed.

In the circuit of FIGS. 15 and 16 the tape/radio selection and ejection button is actuated to shift the operation mode from tape recorder mode to radio mode when the switch 301 is rendered ON state. At this time, the switch 303 is turned on and the base of the transistor 217 is supplied with a bias voltage from the power supply +B via the resistor 305. Therefore, the transistor 217 is turned on unconditionally regardless of whether multi-path distortion is present, thus permitting quick charging of the capacitor 223 according to the charging characteristic as depicted by the line A in FIG. 8 and eventually turning the transistors 229 and 231 on.

Thereafter, even if the switch 303 is turned off, then the capacitor 223 is gradually discharged according to the discharging characteristic as depicted by the line B in FIG. 8. Like the conventional circuit the transistors 229 and 231 are held in on state within 2-3 seconds of tape-to-radio mode transition. The phenomenon is of great importance in reducing noise occurring upon the tape-to-radio mode selection.

Whereas the foregoing has set forth noise reduction when the equipment is shifted from tape recorder mode to radio mode, it is obvious that the present embodiment is equally applicable to reduce noise occurring upon tape-to-radio mode transition or actuation of the power switch. In the circuits of FIGS. 15 and 16, the output of the high pass filter 95 is admitted to the base of the transistor 203 through the capacitor 201 upon throw of the power switch 301 in the same manner as when multi-path distortion occurs. Having been amplified via the transistor 203 and rectified via the voltage booster/rectifier 207, the resulting output of the filter is fed to the base of the switching transistor 217 to turn the same on. In a way similar to noise reduction when the equipment is shifted from tape recorder mode to radio mode, quick charging and subsequent slow discharging of the capacitor 223 keep the transistors 229 and 231 in on state for 2-3 seconds after actuation of the power switch 301 and reduces noise developing thereupon.

It is evident from the foregoing that the above procedure also eliminates any other noise in the same manner, for example, noise developing when the equipment is changed from a particular receiver band other than FM bands to a particular FM band and noise developing upon LOCAL/DX changeover.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A distortion reducing circuit in an FM receiver, said FM receiver comprising:
   front end means for receiving an FM signal containing information corresponding to a range of frequencies and providing an intermediate frequency output signal;
   circuit means for receiving and deomodulating said intermediate frequency output signal to produce a demodulating signal which includes a component corresponding to distortion in the FM signal received by said front end means;
   utilization means responsive to said demodulated signal for reproducing information contained in said FM signal;
   means responsive to the demodulated output signal of said demodulating circuit means for detecting said distortion component; and
   distortion reducing means responsive to said detected distortion component of said distortion detecting means for reducing a high frequency component of the range of frequencies included in said demodulated output signal which is applied to said utilization means while permitting relatively unaffected passage of a low frequency component of a range of frequencies included in said demodulated output signal to said utilization means,
   said distortion reducing means being rapidly responsive to cause reduction upon the received FM signal going from a state of no distortion to one with distortion and less rapidly responsive upon the FM signal going from a state with distortion to one without distortion.

2. A distortion reducing circuit in an FM receiver in accordance with claim 1, which further comprises
   charging/discharging circuit means, and
   charging path means responsive to the output of said distortion detecting means for supplying a charging current to said charging/discharging circuit means,
   said high frequency reducing means being operable as a function of the charging voltage of said charging/discharging circuit means.

3. A distortion reducing circuit in an FM receiver in accordance with claim 2, which further comprises
   discharging path means for discharging an electric charge in said charging/discharging circuit means, and
   a discharging time constant of said discharging path means being selected to be larger than a charging time constant of said charging path means.

4. A distortion reducing circuit in an FM receiver in accordance with claim 1, wherein
   said high frequency component reducing means comprises
   a switching element responsive to the detected output from the distortion detecting means for being rendered conductive or non-conductive, and
   a capacitor selectively coupled between the output of said demodulating circuit and the ground through said switching element.

5. A distortion reducing circuit in an FM receiver in accordance with claim 2, wherein
   said high frequency component reducing means comprises a series circuit interposed between the output of said demodulating circuit and the ground, said series circuit comprising
   a semiconductor element conduction of which is changeable as a function of the voltage of said charging/discharging circuit means, and
   a capacitor connected in series with said semiconductor element.

6. A distortion reducing circuit in an FM receiver in accordance with claim 1, wherein
   said FM receiver comprises an FM stereo receiver,
   said demodulating circuit means comprises an FM stereo demodulating circuit and said utilization means includes means for producing left and right signals, and
   said distortion reducing means includes high frequency component reducing means provided in the paths of said left signal and said right signal, respectively.

7. A distortion reducing circuit in an FM receiver in accordance with claim 6, which further comprises
   monaural mode setting means responsive to the output of said distortion detecting circuit means for forcing the output of said FM demodulating circuit to a monaural mode.

8. A distortion reducing circuit in an FM receiver in accordance with claim 7, wherein
   said FM demodulating circuit comprises
   subcarrier signal generating means, and
   signal separating means responsive to said subcarrier signal and stereo composite signal for providing said left signal and right signal, and
   said monaural mode setting means comprises subcarrier controlling means for controlling said subcarrier signal component in said FM demodulating circuit.

9. A distortion reducing circuit in an FM receiver in accordance with claim 7, which further comprises
   charging/discharging circuit means, and charging path means responsive to the output of said distortion detecting means for supplying a charging current to said charging/discharging circuit means, and said monaural mode setting means being operable responsive to the charge voltage of said charging-/discharging circuit means.

10. A distortion reducing circuit in an FM receiver in accordance with claim 9, which further comprises discharging path means for discharging an electric charge of said charging/discharging circuit means, a discharging time constant of said discharging path means being selected to be larger than a charging time constant of said charging path means.

11. A distortion reducing circuit in an FM receiver in accordance with claim 1, which further comprises an operation switch for enabling said distortion reducing means.

12. A distortion reducing circuit in an FM receiver in accordance with claim 11, wherein said FM receiver is combined with another apparatus of a different operation mode, and said operation switch comprises a switch for selecting said operation mode.

13. A distortion reducing circuit in an FM receiver in accordance with claim 11, wherein said FM receiver comprises a power supply switch, and said operation switch comprises said power supply switch.

14. A distortion reducing circuit in an FM receiver in accordance with claim 1, wherein said distortion detecting means comprises a high pass filter.

15. A distortion reducing circuit in an FM receiver in accordance with claim 1, further comprising pulsive noise removing circuit means including a high pass filter for receiving the demodulated output signal of said demodulating circuit means, a noise detector responsive to the output of said high pass filter for detecting a noise component, a monostable multivibrator responsive to the output of said noise detector for being operable, and a gate circuit responsive to the output of said monostable multivibrator for gating the output of said demodulating circuit means to said utilization means, and said distortion detecting means comprising said high pass filter being included in said pulsive noise removing circuit means.

16. A distortion reducing circuit in an FM receiver in accordance with claim 1 wherein said detected distortion component of said demodulated signal corresponds to multi-path distortion in said received FM signal, said distortion detecting means comprising a high pass filter for receiving said demodulated signal and producing an output in response to a multi-path distortion component in said received FM signal, means for converting the output of said high pass filter into a direct current signal which is utilized as a multi-path distortion detected output.

17. A distortion reducing circuit in an FM receiver in accordance with claim 16, further comprising pulsive noise removing circuit means having a high pass filter for receiving the output of said demodulating circuit means, a noise detector responsive to the output of said high pass filter for detecting a noise component, a monostable multivibrator responsive to the output of said noise detector for being operable, and a gate circuit responsive to the output of said monostable multivibrator for gating the output of said demodulating circuit means to said utilization means, and the output of said high pass filter included in said pulsive noise removing circuit being applied to said direct current converting means.

18. A distortion reducing circuit in an FM receiver said FM receiver comprising:

front end means for receiving an FM signal containing information corresponding to a range of frequencies and providing an intermediate frequency output signal;

circuit means for receiving and demodulating said intermediate frequency output signal to produce a demodulated signal which includes a component corresponding to distortion in the FM signal received by said front end means;

utilization means responsive to said demodulated signal for reproducing information contained in said FM signal;

means responsive to the demodulated output signal of said demodulating circuit means for detecting said distortion component;

distortion reducing means responsive to said detected distortion component of said distortion detecting means for reducing a high frequency component of the range of frequencies included in said demodulated output signal which is supplied to said utilization means while permitting low frequency component of relatively unaffected passage of a range of frequencies included in said demodulated output signal to said utilization means;

charging/discharging circuit means;

charging path means responsive to the output of said distortion detective means for supplying a charging current to said charging/discharging circuit means said high frequency reducing means being operable as a function of the charging voltage of said charging/discharging circuit means;

discharging path means for discharging an electric charge in said charging/discharging circuit means; and a discharging time constant of said discharging path means being selected to be larger than a charging time constant of said charging path means.

19. A distortion reducing circuit in an FM receiver in accordance with claim 18, wherein said charging path means comprises a gain element for receiving the output of said distortion detecting means, said charging path means supplying a charging current to said charging/discharging circuit means as a function of the output of said gain element.

20. A distortion reducing circuit in an FM receiver in accordance with claim 19, wherein said charging path means comprises rectifying circuit means receiving the output of said gain element, and charging current controlling means for controlling said charging current as a function of the output of said rectifying circuit means.

21. A distortion reducing circuit in an FM receiver in accordance with claim 20, which further comprises switching means responsive to the strength of the input electric field being applied to said antenna for enabling or disabling said charging path means.

* * * * *